United States Patent
Wang

(10) Patent No.: US 6,907,993 B2
(45) Date of Patent: Jun. 21, 2005

(54) CONNECTOR PACKAGE WITH SUPPORTING WALLS

(75) Inventor: Wenxin Wang, Kunsan (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 140 days.

(21) Appl. No.: 10/308,636

(22) Filed: Dec. 2, 2002

(65) Prior Publication Data

US 2004/0000504 A1 Jan. 1, 2004

(30) Foreign Application Priority Data

Jun. 28, 2002 (TW) ...................................... 91209770 U

(51) Int. Cl.$^7$ ............................................. B65D 73/02
(52) U.S. Cl. ...................... 206/725; 206/564; 206/724
(58) Field of Search ........................ 206/719, 724–725, 206/564, 589

(56) References Cited

U.S. PATENT DOCUMENTS 5,551,572 A * 9/1996 Nemoto ..................... 206/725
5,848,703 A * 12/1998 Murphy et al. ............. 206/725
6,612,442 B2 * 9/2003 Soh et al. ................... 206/725

* cited by examiner

Primary Examiner—Bryon P. Gehman
(74) Attorney, Agent, or Firm—Wei Te Chung

(57) ABSTRACT

A package (1) for receiving a plurality of electrical socket connectors (4) comprises an elongate housing (2). The housing includes a set of first supporting portions (21) in each of opposite ends thereof, and an intermediate set of second supporting portions (22) between the two sets of first portions. Each first portion includes a rectangular bottom wall (210). A pair of through slots (211) is defined in the bottom wall at opposite longitudinal sides respectively of the first portion. The set of second portions comprises a single bottom wall (220) that spans an entire area of all the second portions. The socket connectors are fittingly received in the first portions and the second portions so that they abut the respective bottom walls. The bottom walls of the first portions and the bottom wall of the second portions cooperatively render the package strong enough to resist deformation.

4 Claims, 4 Drawing Sheets

CONNECTOR PACKAGE WITH SUPPORTING WALLS

BACKGROUND OF THE INVENTION

1. Field of the Invention

The present invention relates to a package, and particularly to a package used for receiving electrical connectors therein and providing easy and safe transportation and handling of the connectors.

2. Description of the Prior Art

Delicate electronic components, such as CPU sockets, are often packaged into trays that are stacked into freight containers for transportation, as disclosed in "Technology Analysis of Electrical Connector" (Connector Specifier, February 2001, pp.18–20). Such tray packages each generally have an elongate housing comprising a plurality of supporting portions. The supporting portions are arranged in an array for respectively receiving CPU sockets therein. Some of the supporting portions comprise bottom walls, while others do not. Referring to FIGS. 3 and 4, a conventional CPU socket connector package 9 comprises an elongate housing 91 having a plurality of supporting portions defined therein. A rectangular hole 911 is defined in each of several supporting portions located at each of opposite ends of the housing 91. Other supporting portions at a middle of the housing 91 do not have holes 911, and such supporting portions form a rectangular array of containers 910. Each container 910 has a bottom wall, and the bottom walls cooperatively enhance the strength of the package 9. CPU socket connectors 8 (only one shown in FIG. 3) normally are mounted from the top of the package 9 into respective supporting portions. The socket connectors 8 are retained in the holes 911 and the containers 910 respectively. The package 9 is typically made of thermoplastic material. During transportation, such as in a freight container, the packages 9 are liable to be subjected to squeezing and deformation. Under the weight of the socket connectors 8 in the package 9, the supporting portions are liable to deform and distort and warp the package 9. When this happens, the socket connectors 8 are prone to be damaged or even destroyed.

Therefore, an improved connector package which overcomes the above-mentioned problems is desired.

SUMMARY OF THE INVENTION

An object of the present invention is to provide an electrical connector package having strong supporting portions that minimize the risk of accidental damage to connectors installed therein.

Another object of the present invention is to provide an electrical connector package which is light and easily manufactured.

To achieve the above objects, a package of the present invention for receiving a plurality of electrical socket connectors comprises an elongate housing. The housing comprises a set of first supporting portions in each of opposite ends thereof, and a set of second supporting portions between the two sets of first portions. Each set of first portions and the set of second portions are each arranged in an array. Each first portion comprises a rectangular bottom wall. A pair of through slots is defined in the bottom wall at opposite longitudinal sides respectively of the first portion. The set of second portions comprises a single bottom wall that spans an entire area of all the second portions. The socket connectors are fittingly received in the first portions and the second portions so that they abut the respective bottom walls. The bottom walls of the first portions and the bottom wall of the second portions cooperatively render the package strong enough to resist deformation. Thus the risk of damage to the socket connectors mounted in the package is minimized.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
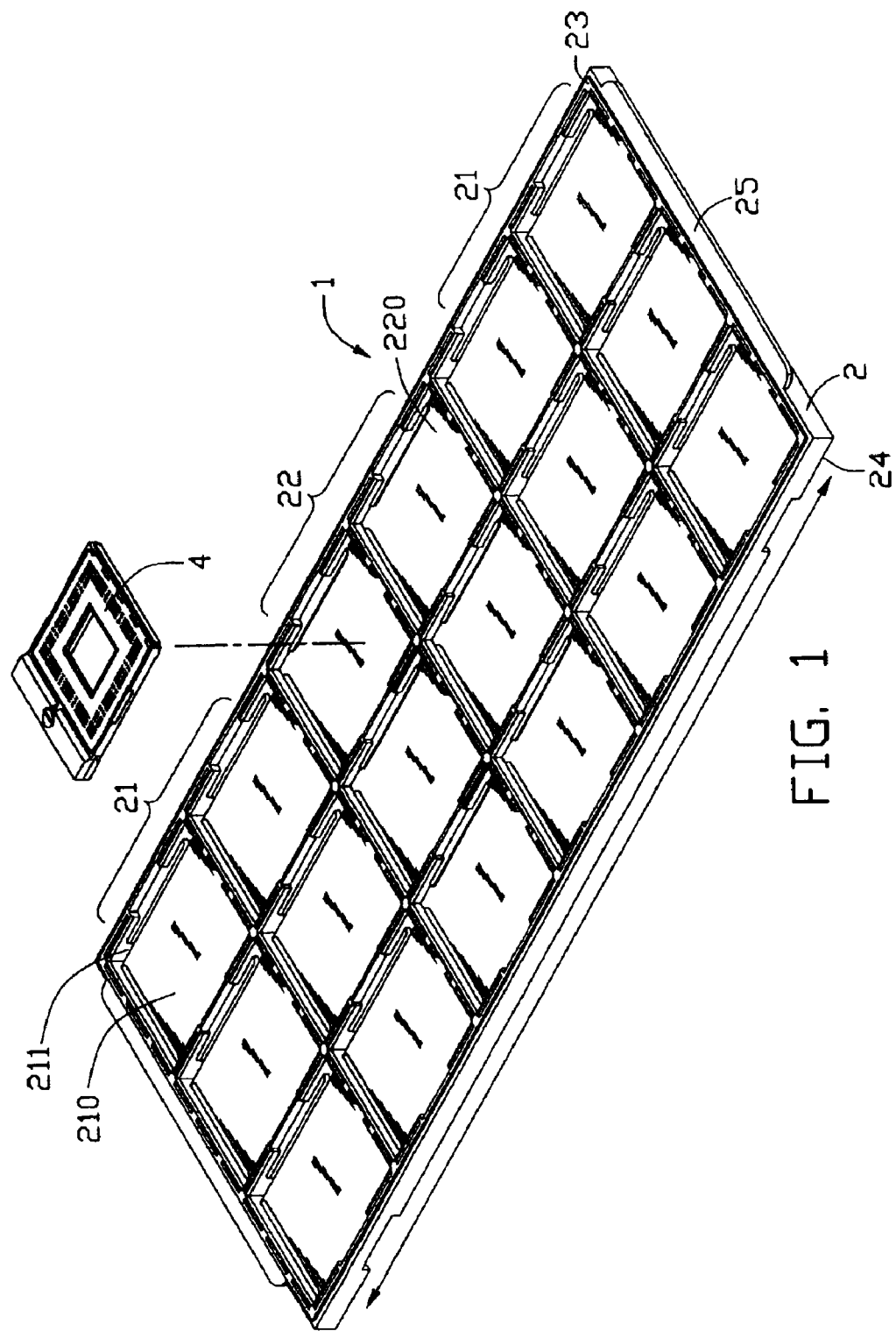
FIG. 1 is an isometric view of a package in accordance with a preferred embodiment of the present invention, together with a socket connector ready to be received in the package.

Referring to FIG. 1, a package 1 in accordance with a preferred embodiment of the present invention is used for packaging a plurality of electrical socket connectors 4 (only one shown). The socket connectors 4 are used for connecting central processing units (CPUs) to printed circuit boards (PCBs) in personal computers (PCs).

Figure 2:
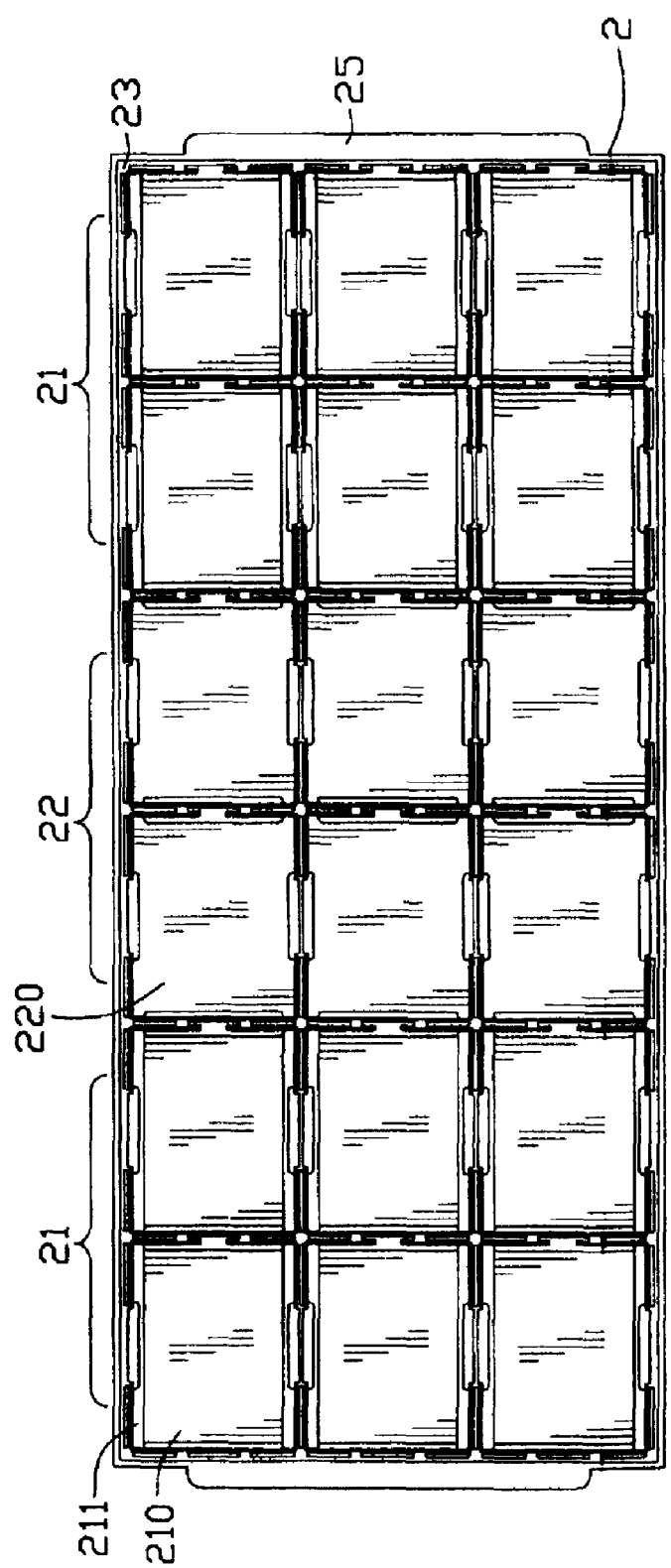
FIG. 2 is a top plan view of the package of FIG. 1.
Figure 3:
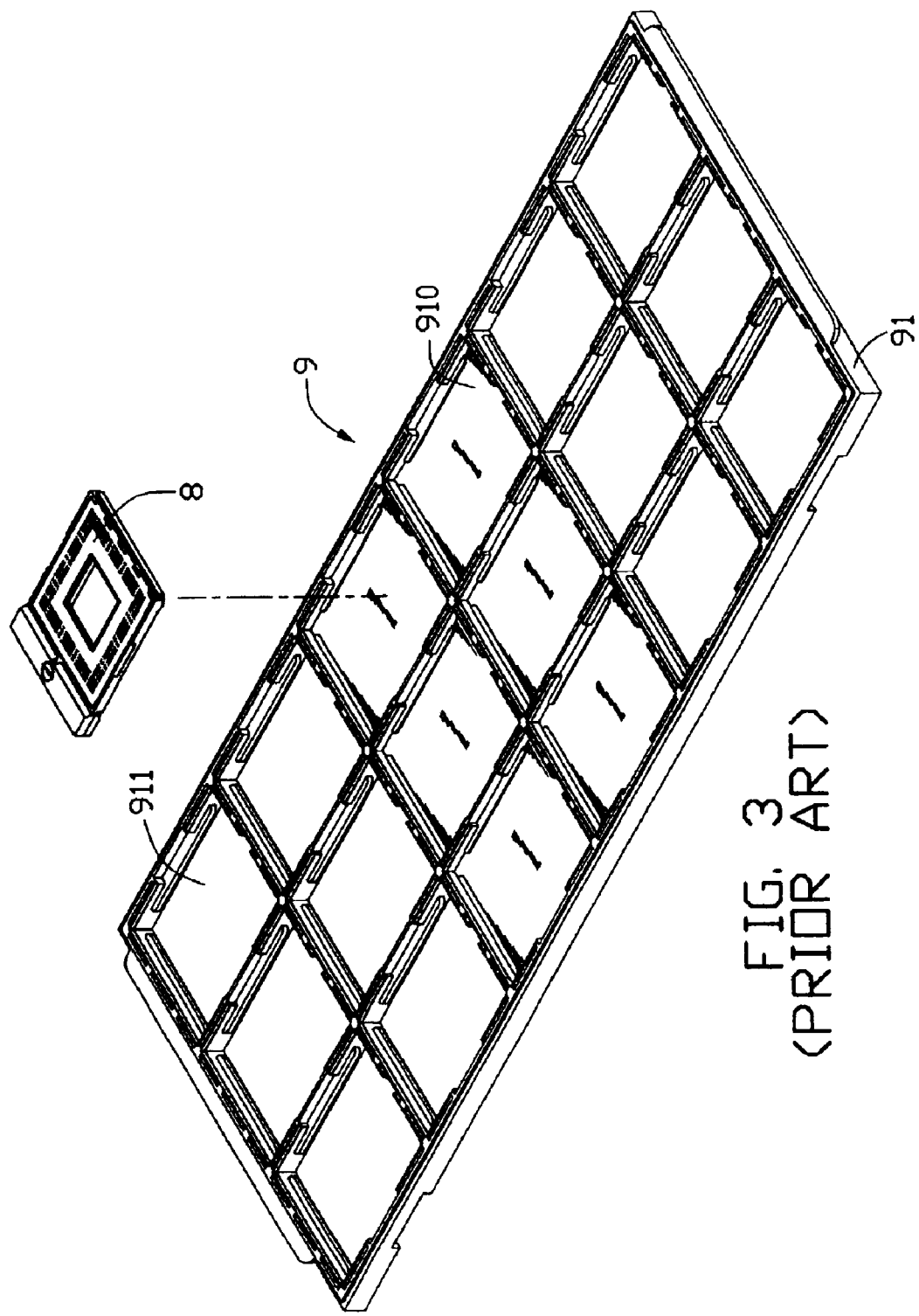
FIG. 3 is an isometric view of a conventional package, together with a socket connector ready to be received in the package.
Figure 4:
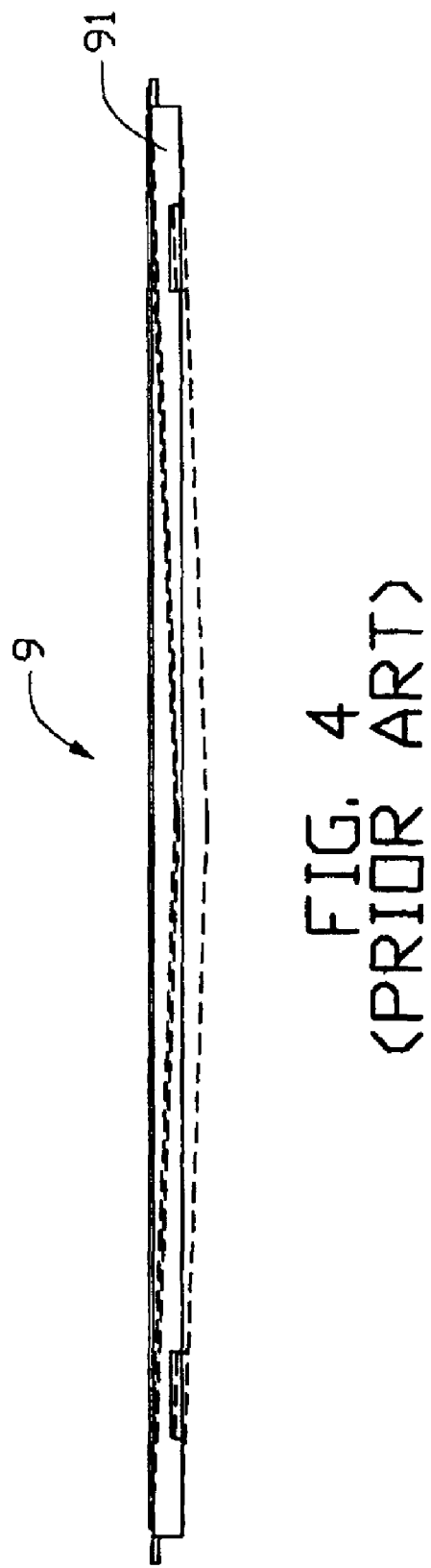
FIG. 4 is a side plan view of the package of FIG. 3, and shows a shape of the package in dashed lines in the case when the package has been deformed.

Referring to FIGS. 1 and 2, the package 1 comprises an elongate housing 2. The housing 2 has a top surface 23 via which the socket connectors 4 are normally mounted into the package 1, and a bottom surface 24 opposite to the top surface 23. The housing 2 includes a set of first supporting portions 21 in each of opposite ends thereof, and a set of second supporting portions 22 between the two sets of first portions 21. Each set of first portions 21 and the set of second portions 22 are each arranged in an array having two columns and three rows. Thus, the package 1 can receive a total of eighteen socket connectors 4. Each first portion 21 comprises a rectangular bottom wall 210. A pair of through slots 211 is defined in the bottom wall 210 at opposite longitudinal sides respectively of the first portion 21 (best seen in FIG. 2). The bottom wall 210 enhances the structural strength of the package 1. A socket connector 4 is fittingly received in the first portion 21 so that it abuts the bottom wall 210. Each second portion 22 is similar in structure to each first portion 21, with the following two differences. First, the set of second portions 22 comprises a single bottom wall 220 that spans an entire area of all the second portions 22. The bottom wall 220 enhances the structural strength of the package 1. Second, there are no through slots defined in the bottom wall 220. A socket connector 4 is fittingly received in each second portion 22. A pair of handles 25 is formed at the opposite ends of the housing 2 respectively, to facilitate handling of the package 1.

When the socket connectors 4 are received in the package 1, the package 1 is subjected to the weight of the socket connectors 4 and its own weight. In addition, when the package 1 is undergoing transportation such as in a freight container, the package 1 is liable to be subjected to squeezing and other external pressure. Nevertheless, the walls 210 of the first portions 21 and the wall 220 of the second portions 22 cooperatively render the package 1 strong enough to resist deformation. Thus the risk of damage to the socket connectors 4 mounted into the package 1 is minimized. In addition, the through slots 211 result in less material being needed to make the housing 2, and in making the package 1 lighter. This can reduce manufacturing costs of the package 1, and transportation costs associated with the package 1.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A tray for retaining a plurality of electrical connectors therein, comprising:

a rectangular integrated housing defining respective longitudinal and transverse directions perpendicular to each other, a dimension along said longitudinal direction being larger than that along the transverse direction;

a plurality of supporting portions arranged in the housing in a matrix manner;

the supporting portions located at a center portion of the housing being equipped with a single bottom wall spanning the entire area of the center portion, while the remaining supporting portions located at two opposite end portions along said longitudinal direction each being equipped with partially dimensioned bottom walls thereof.

2. The tray as claimed in claim 1, wherein at least one through slot is formed in the bottom wall of each of said supporting portions located at said two opposite end portions.

3. The tray as claimed in claim 2, wherein said through slot extends along said longitudinal direction.

4. The tray as claimed in claim 3, wherein said through slot is located in an edge area of the bottom wall.

* * * * *